United States Patent [19]
Ooishi

[11] Patent Number: 5,985,712
[45] Date of Patent: Nov. 16, 1999

[54] METHOD OF FABRICATING FIELD EFFECT TRANSISTOR WITH AN LDD STRUCTURE

[75] Inventor: Mitsuma Ooishi, Tokyo, Japan

[73] Assignee: NEC Corporation, Tokyo, Japan

[21] Appl. No.: 08/963,622

[22] Filed: Nov. 4, 1997

Related U.S. Application Data

[63] Continuation of application No. 08/626,019, Apr. 1, 1996, abandoned.

[30]  Foreign Application Priority Data

Mar. 31, 1995 [JP] Japan ................................. 7-075127

[51] Int. Cl.$^6$ ............................................... H01L 21/8238
[52] U.S. Cl. ........................... 438/231; 438/305; 438/592
[58] Field of Search .................................. 438/592, 305, 438/303, 307, 231

[56]  References Cited

U.S. PATENT DOCUMENTS

| | | | |
|---|---|---|---|
| 5,089,432 | 2/1992 | Yoo | 437/40 |
| 5,094,712 | 3/1992 | Becker et al. | 156/643 |
| 5,171,700 | 12/1992 | Zamanian | 437/44 |
| 5,259,923 | 11/1993 | Hori et al. | 156/643 |
| 5,399,514 | 3/1995 | Ichikawa | 437/34 |

OTHER PUBLICATIONS

Wolf et al., "Silicon Processing for the VLSI Era vol. 1: Process Technology", pp. 323–325, Lattice Press, 1986.
Seiki Ogura et al, "Elimination of Hot Electron Gate Current by the Lightly Doped Drain–Source Structure", *International Electron Device Meeting (IEDM) Technical Dsigest*, 1981, pp. 651–654.

*Primary Examiner*—Richard Booth
*Attorney, Agent, or Firm*—Sughrue, Mion, Zinn, Macpeak & Seas, PLLC

[57]  ABSTRACT

After the formation of a gate electrode, thermal oxidation is performed while an area where a source and drain are to be formed is covered with a gate insulating film, impurity ions are then injected to form low-concentration source and drain regions, an insulating spacer is then formed on the side surface of the gate electrode, and an insulating film is deposited on exposed source and drain regions by chemical vapor deposition. This allows the recovery of the breakdown voltage of the gate insulating film, which is damaged by an MOS transistor whose gate electrode contains a high melting-point metal silicide, and prevents metal oxide from being contained in the insulating film on the source and drain regions.

16 Claims, 6 Drawing Sheets

METHOD OF FABRICATING FIELD EFFECT TRANSISTOR WITH AN LDD STRUCTURE

This is a Continuation of application Ser. No. 08/626,019 filed Apr. 1, 1996 now abandoned.

BACKGROUND OF THE INVENTION

1. Field of the Invention

The present invention relates to a method of manufacturing a semiconductor device, and, more particularly, to a method of fabricating a field effect transistor (FET) with an LDD structure which has a gate electrode containing high melting-point metal silicide such as polycide.

2. Description of the Related Art

To begin with, a method of a polycrystalline silicon gate electrode IGFET will be discussed. This method is described in, for example, International Electron Device Meeting (IEDM) Technical Digest, 1981, pp 651–654.

As shown in FIG. 1A, a device-forming area is formed on a P type silicon semiconductor substrate 1 by a field oxide film 2. A gate oxide film 3 is formed on the device-forming area on the substrate 1, and a gate electrode 4 formed of a polycrystalline silicon film is patterned on the gate oxide film 3.

Next, with the gate electrode 4 as a mask, first impurity ions are injected into the surface of the substrate 1 to form an N⁻ type source and drain region 5 in the surface of the substrate 1, as shown in FIG. 1B.

Then, a silicon oxide film 6 is deposited on the entire surface of the resultant structure by chemical vapor deposition as shown in FIG. 1C.

Subsequently, anisotropic dry etching is performed on this silicon oxide film 6 to form an insulating spacer 7 on the side wall of the gate electrode 4 as shown in FIG. 1D.

Then, as shown in FIG. 1E, with the gate electrode 4 and insulating spacer 7 used as masks, second impurity ions are injected in the surface of the substrate 1 at a higher concentration than the first impurity ions, thus forming a high-concentration ion injection region 8.

Next, as shown in FIG. 1F, thermal oxidation is carried out to form an N⁺ type source and drain region 8a from the high-concentration ion injection region 8 and form a thermal oxide film 9b on this source and drain region 8a. This thermal oxidation also forms a thermal oxide film 9a on the gate electrode 4.

According to this prior art, a heat treatment is performed in the oxide atmosphere in order to form the N⁺ type source and drain region 8a, but the impurity diffusion speed is faster than the speed of the heat treatment in the inactive gas. This heat treatment in such an oxide atmosphere therefore becomes inappropriate to miniaturize transistors and improve the high integration thereof.

As a solution to this shortcoming, the order of the injection of the second and thermal oxidation is reversed in such a way that after the insulating spacer 7 is formed, thermal oxidation is performed to form the thermal oxide films 9a and 9b as shown in FIG. 2A, after which the second impurity ions are injected into the surface of the substrate 1 and a heat treatment is then carried out in the inactive gas to form the N⁺ type source and drain region 8b, as shown in FIG. 2B.

An LDD-IGFET having a polycide gate electrode is formed in conformity to the method of fabricating an LDD-IGFET having a polycrystalline silicon gate electrode.

This will be discussed below more specifically. As shown in FIG. 3A, a polycrystalline silicon film 11 and tungsten silicide film 12 are stacked on a gate oxide film 3 and this stacked films are patterned to form a gate electrode 10.

Then, first impurity ions are injected into the surface of the substrate 1 to form an N⁻ type source and drain region 5, as shown in FIG. 3B.

Then, a silicon oxide film 6 is deposited on the entire surface of the resultant structure as shown in FIG. 3C.

Anisotropic etching is then performed to form an insulating spacer 7 on the side wall of the gate electrode 10, as shown in FIG. 3D.

Next, thermal oxidation is executed to form thermal oxide films 9a and 9b on the gate electrode 10 and source and drain region 5, as shown in FIG. 3E.

Then, with the gate electrode 10 and insulating spacer 7 used as masks, second impurity ions are injected into the substrate surface at a higher concentration than the first impurity ions to form an N⁺ type source and drain region 8c.

According to this prior art, however, at the time of patterning the polycide gate electrode 10 by dry etching, the gate oxide film 3 may be damaged, lowering the breakdown voltage of the gate oxide film 3. When the tungsten silicide film 12 is oxidized in the thermal oxidation step to protect the N⁻ type source and drain region 5 which is exposed at the time of forming the insulating spacer 7, the tungsten oxide flies and is diffused in the oxide atmosphere to permeate in the thermal oxide film 9b on the N⁻ type source and drain region 5, so that the tungsten oxide is diffused into the PN junction between the source and drain region 5 and the P type silicon semiconductor substrate 1 in the later heating step, thus increasing the leak current.

SUMMARY OF THE INVENTION

Accordingly, it is an object of the present invention to provide a method of fabricating a field effect transistor with an LDD structure, which can prevent the breakdown voltage of a gate insulating film from dropping and the leak current from increasing.

A method of fabricating a field effect transistor with an LDD structure according to one aspect of this invention comprises the steps of:

forming a gate insulating film on an active region on a surface of a semiconductor substrate;

selectively covering the gate insulating film to form a gate electrode including a high melting-point metal silicide film;

forming a thermal oxide film on a top surface and a side surface of the gate electrode with the active region covered with a gate insulating film;

forming a low-concentration source and drain region in the active region by first ion injection;

depositing a first insulating film and performing anisotropic etching to form an insulating spacer on the side surface of the gate electrode; and depositing a second insulating film for covering the low-concentration source and drain region exposed by the anisotropic etching and then forming a high-concentration source and drain region in the active region by second ion injection.

A method of fabricating a field effect transistor with an LDD structure according to another aspect of this invention comprises the steps of:

forming a device-forming area in a surface portion of a semiconductor substrate to define a first active region and a second active region;

forming a first gate insulating film and a second gate insulating film respectively on surfaces of the first active region and the second active region;

selectively covering the first gate insulating film and the second gate insulating film to form a first gate electrode and a second gate electrode each including a high melting-point metal silicide film;

forming thermal oxide films on top and side surfaces of the first gate electrode and the second gate electrode, with the first active region and the second active region respectively covered with a first gate insulating film and a second gate insulating film;

forming a low-concentration source and drain region in both the first and second active regions by first ion injection;

depositing a first insulating film and performing anisotropic etching to form an insulating spacer on the side surfaces of the first and second gate electrodes;

depositing a second insulating film for covering the low-concentration source and drain region exposed by the anisotropic etching; and covering the second active region with a mask and then performing second ion injection to form a high-concentration source and drain region in the first active region.

It is preferable that an amorphous high-melting point stoichiometric silicon rich refractory metal silicide be formed and be polycrystallized at a time of thermal oxidation. It is also preferable that the gate electrode be a polycide gate electrode.

According to this invention, a thermal oxide film is formed on the top and side surfaces of the gate electrode with the active region covered with the gate insulating film, so that a damage on the gate insulating film caused at the time of patterning can be recovered without substantially any contamination by metal oxide. Because second ion injection or the like is performed after covering the low-concentration source and drain region with the second insulating film, it is possible to prevent metal oxide from the surface of the gate electrode from contaminating the source and drain region in the subsequent steps.

DETAILED DESCRIPTION OF THE PREFERRED EMBODIMENTS

Preferred embodiments of the present invention will now be described with reference to the accompanying drawings.

Figure 1A:
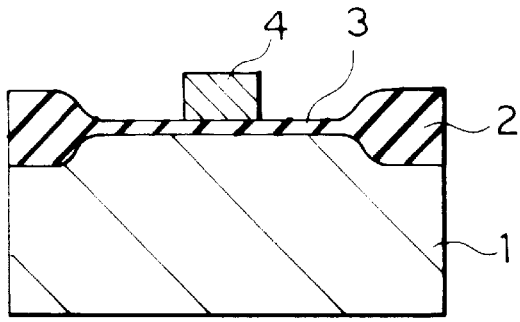
FIGS. 1A through 1F are cross-sectional views illustrating a conventional method of fabricating a silicon gate LDD-IGFET step by step.
Figure 1D:
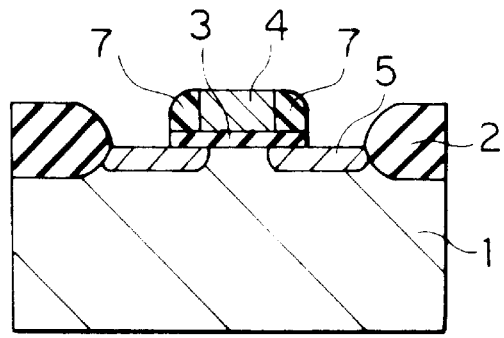
Figure 1B:
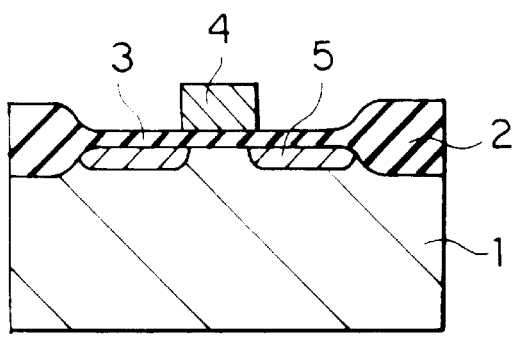
Figure 1E:
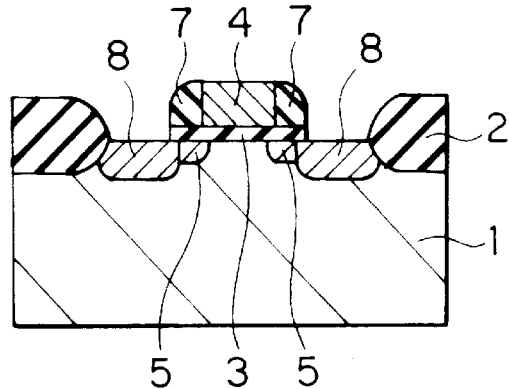
Figure 1C:
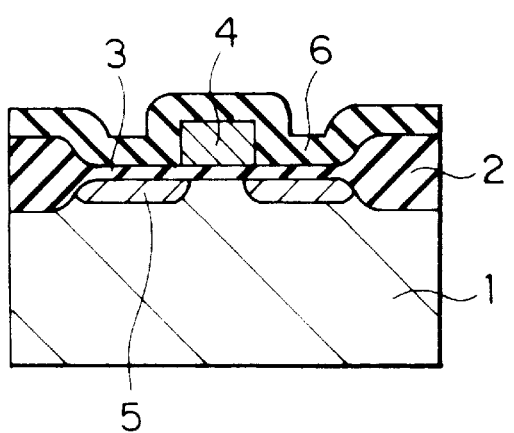
Figure 1F:
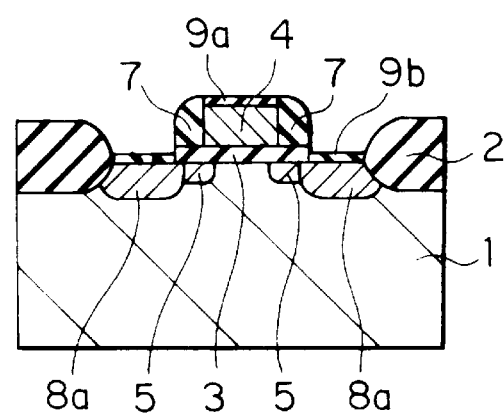
Figure 2A:
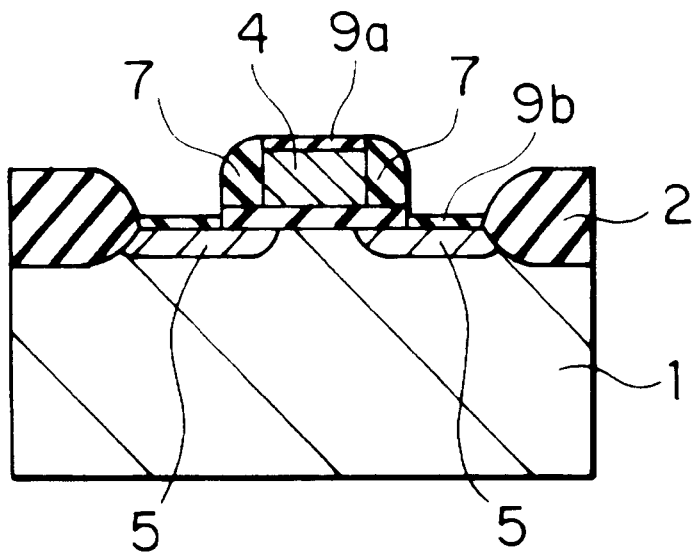
FIGS. 2A and 2B are cross-sectional views showing another conventional method of fabricating a silicon gate LDD-IGFET step by step.
Figure 2B:
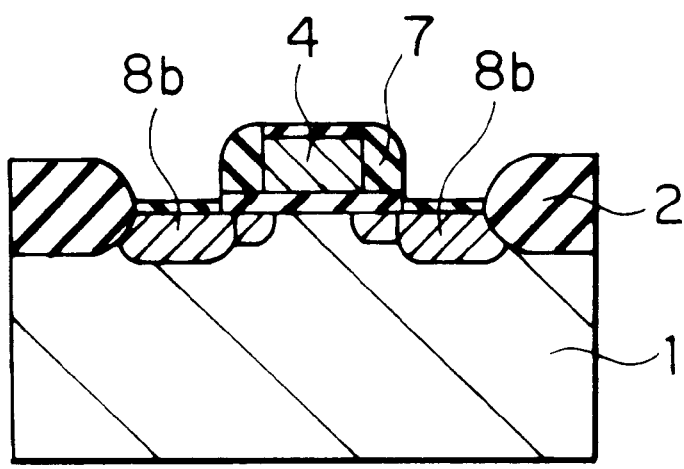
Figure 3A:
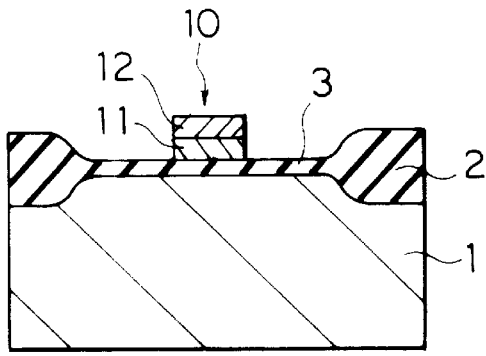
FIGS. 3A through 3F are cross-sectional views illustrating a step-by-step conventional method of fabricating an LDD-IGFET having a polycide gate electrode.
Figure 3D:
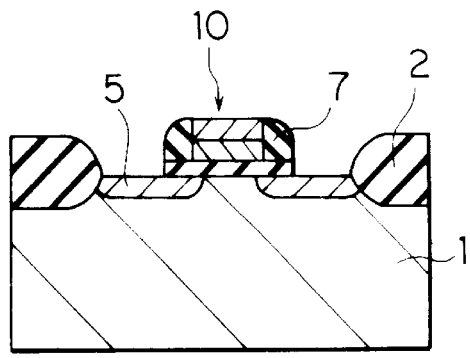
Figure 3B:
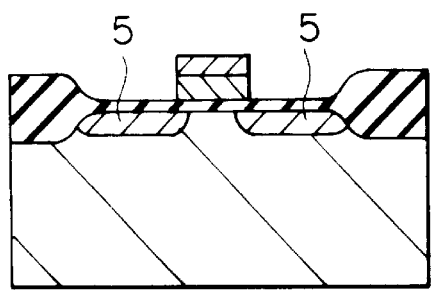
Figure 3E:
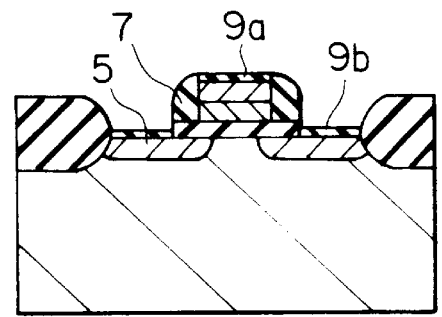
Figure 3C:
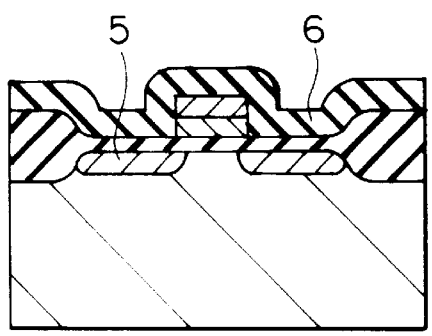
Figure 3F:
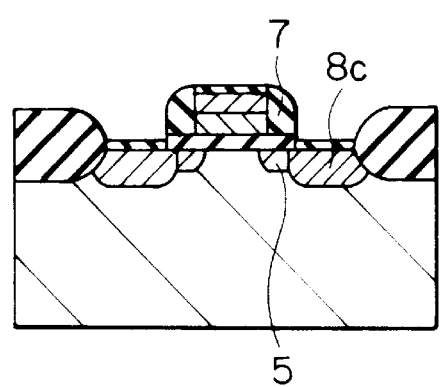
Figure 4A:
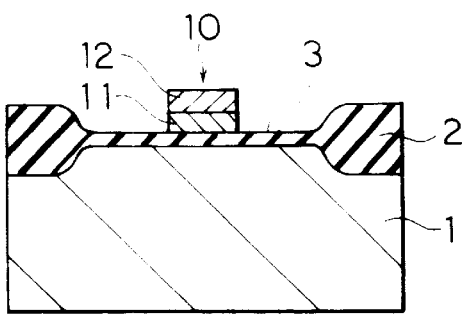
FIGS. 4A through 4H are cross-sectional views illustrating a step-by-step method of fabricating a field effect transistor having an Ldd structure according to the first embodiment of the present invention.

FIGS. 4A through 4H illustrate a step-by-step method of fabricating a field effect transistor according to the first embodiment of this invention. As shown in FIG. 4A, first, a field oxide film 2 is formed on the surface of a P type silicon semiconductor substrate 1 to define an active region. Then, a gate insulating film 3 is formed 6 to 12 nm thick on the surface of the substrate 1 where the active region is located.

Then, a polycrystalline silicon film 11 doped with phosphorous is deposited 20 to 150 nm thick by chemical vapor deposition, and an amorphous $WSi_x$ (2<X<3) film 12 containing stoichiometric silicon rich refractory metal silicide is formed to have a thickness of 100 to 200 nm by sputtering while keeping the substrate temperature at 400° C., after which patterning is performed by photolithography and anisotropic etching to form a gate electrode 10. At this time, first, a gas mixture of $SF_6$, HBr and He is used to etch the $WSi_x$ film and then a gas mixture of $Cl_2$ and HBr is used to etch the polycrystalline silicon film so that the gate oxide film 3 is hardly etched.

Figure 4E:
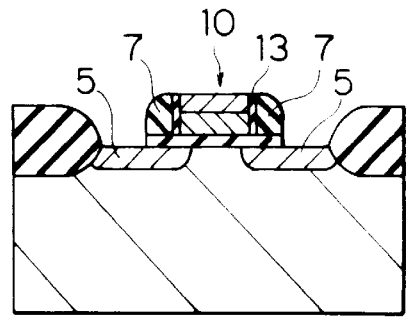
Figure 4B:
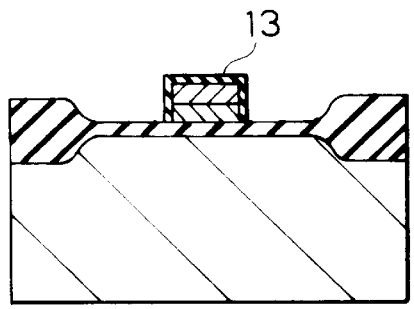

Next, thermal oxidation is performed in the oxide atmosphere at 800 to 900° C. to form a thermal oxide film 13 with a thickness of 2 to 15 nm on the top and side surfaces of the gate electrode 10, as shown in FIG. 4B. This thermal oxidation permits the recovery of the breakdown voltage of the gate oxide film 3 damaged by the anisotropic etching. If the tungsten silicide film 12 is polycrystalline, abnormal oxidation may occur by the oxidation of the grain boundary. According to this embodiment, however, the tungsten silicide film 12 is amorphous and contains stoichiometric silicon rich refractory metal silicide, so that such abnormal oxidation does not occur.

Figure 4F:
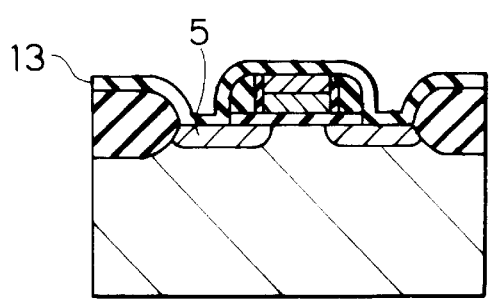
Figure 4C:
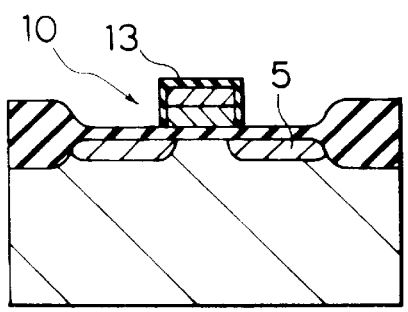

Next, as shown in FIG. 4C, with the gate electrode 10 as a mask, phosphorus ions are injected into the surface of the substrate 1 with the energy of 30 to 50 keV at a dose of $1\times10^{13}$ to $5\times10^{13}$ cm$^{-2}$ (first impurity ion injection), thereby forming an N$^-$ type source and drain region 5 in the surface of the substrate 1.

Figure 4G:
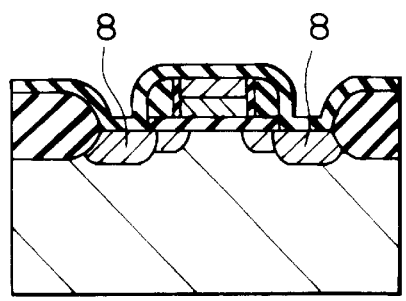
Figure 4D:
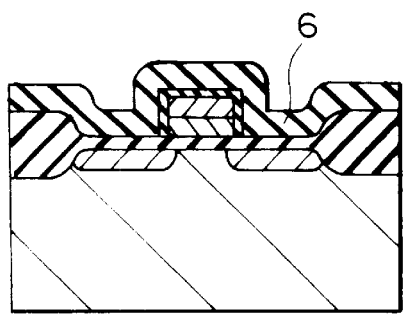
Figure 4H:
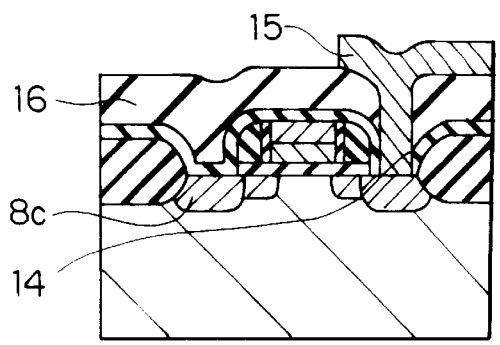

Then, as shown in FIG. 4D, a silicon oxide film 6 is deposited 90 to 200 nm thick by chemical vapor deposition.

Subsequently, an insulating spacer 7 is formed on the side surface of the gate electrode 10 by anisotropic etching, as shown in FIG. 4E. At the time of this anisotropic etching, the gate oxide film 13 is removed on the N$^-$ type source and drain region from which the insulating spacer 7 is removed.

Next, a silicon oxide film 13 is deposited in 5 to 20 nm thick on the entire surface by chemical vapor deposition to cover the exposed N$^-$ type source and drain region 5, as shown in FIG. 4F.

Then, as shown in FIG. 4G, with the thermal oxide film 13 and side-wall spacer 7 as masks, Arsenic ions are injected into the surface of the substrate 1 with the energy of 30 to 70 keV at a dose of $1\times10^{15}$ to $5\times10^{18}$ cm$^{-2}$ (second impurity ion injection), thereby forming a high-concentration ion injection region 8.

Then, an interlayer insulating film 16 of BPSG is deposited on the entire surface and the resultant structure is subjected to a heat treatment in an inactive gas atmosphere at 700 to 950° C. for five minutes to one hour. At this time, the high-concentration ion injection region 8 is activated to become an N$^+$ type source and drain region 8c. Then, a contact hole 14 is formed in the interlayer insulating film 16 and an interconnection layer 15 of aluminum is so formed as to bury the contact hole 14.

Through the above steps, a field effect transistor with an LDD structure according to this embodiment is manufactured. Since the gate oxide film 3 which not been damaged at the time of performing patterning to form the gate electrode 10 is recovered, as mentioned above, by the thermal oxidation in FIG. 4B according to this embodiment, the breakdown voltage of the gate oxide film is prevented from decreasing. At the time of the heat treatment after the second impurity ion injection, the substrate surface is covered with the silicon oxide film 13, so that the source and drain region 8c is not contaminated by metal oxide from the gate electrode material, thus preventing the leak current at the PN junction from increasing.

Figure 5A:
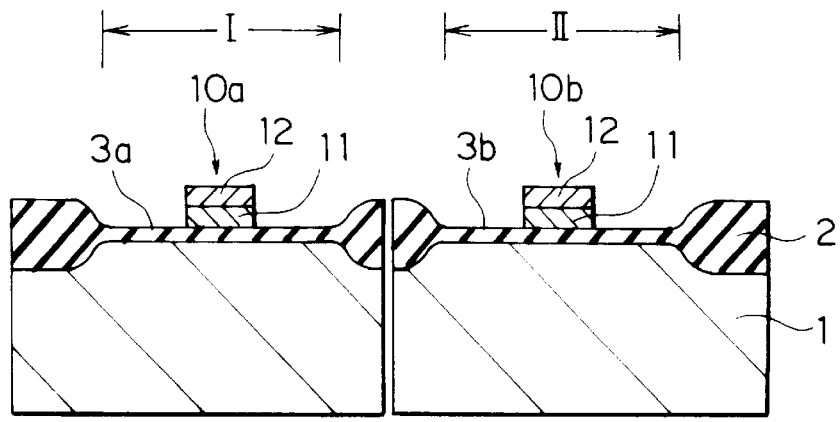
FIGS. 5A through 5E are cross-sectional views illustrating a step-by-step method of fabricating a field effect transistor having an LDD structure according to the second embodiment of this invention.

The second embodiment of this invention will now be described with reference to FIGS. 5A to 5E. First, as shown in FIG. 5A, a device-forming area is formed in the surface of a P type silicon semiconductor substrate 1 to define a first active region I and a second active region II. Then, a first gate insulating film 3a and a second gate insulating film 3b are respectively formed 6 to 12 nm thick on the surfaces of the first active region I and the second active region II. Then, a polycide film comprised of a polycrystalline silicon film 11 and a $WSi_x$ film 12 stacked one on the other is formed by selectively covering the first gate insulating film 3a and the second gate insulating film 3b, and the stacked layer body is patterned by anisotropic dry etching, thereby forming a first gate electrode 10a and a second 10b.

Figure 5B:
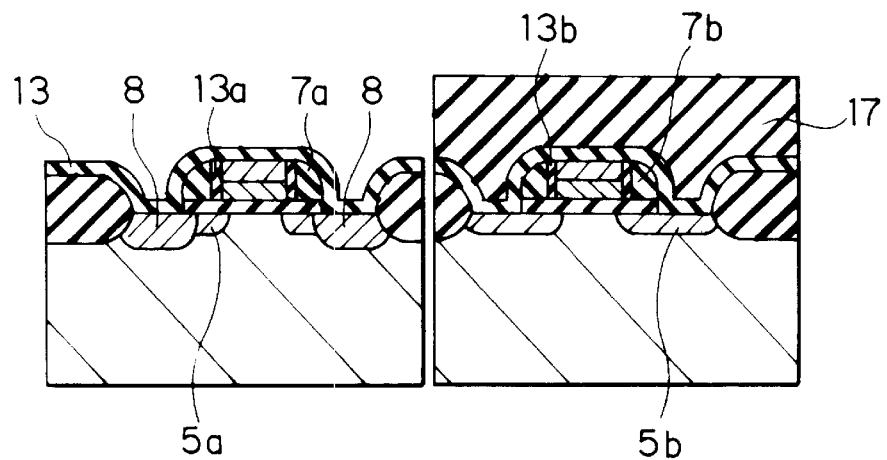
Figure 5C:
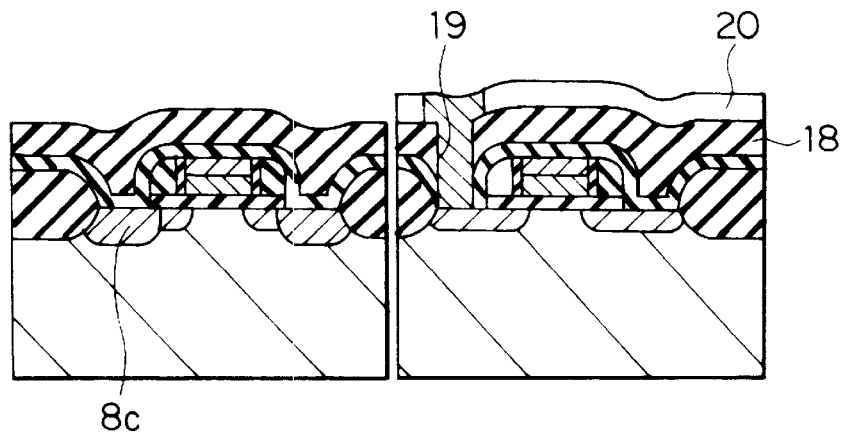

Then, as shown in FIG. 5B, ion injection is performed with the first active region I and second active region II respectively covered with the first gate oxide film 3a and second gate oxide film 3b, forming thermal oxide films 13a and 13b on the top and side surfaces of the first gate electrode 10a and second gate electrode 10b, as per the first embodiment. Then, with the electrodes 10a and 10b as masks, N⁻ type source and drain regions 5a and 5b are respectively formed in the first active region I and second active region II in the surface of the substrate 1 under the same conditions as given in the first ion injection of the first embodiment. Then, a first silicon oxide film (see the silicon oxide film 6 in FIG. 4D) is deposited on the entire surface after which the first silicon oxide film is subjected to anisotropic etching to form insulating spacers 7a and 7b on the side surfaces of the first and second gate electrodes 10a and 10b.

Then, a second silicon oxide film 13 which covers the N⁻ type source and drain regions 5a and 5b, exposed by the anisotropic etching, is deposited after which the second active region II is covered with a mask (photoresist film 17). Then, impurity ions are injected under the same conditions as given in the second ion injection in the first embodiment, thereby forming a high-concentration ion injection region 8 for forming an N⁺ type source and drain region in the first active region I.

Next, the photoresist film 17 is removed, an interlayer insulating film 18 of BPSG is deposited and the resultant structure is subjected to a heat treatment in the inactive gas atmosphere at 700 to 950° C. for five minutes to one hour. At this time, the high-concentration ion injection region 8 becomes an N⁺ type source and drain region 8c. In the above-described manner, an LDD-IGFET like that of the first embodiment is formed in the first active region I, and an IGFET having no N⁺ type source and drain regions is formed in the second active region II. Then formed in the interlayer insulating film 18 is a contact hole 19 which reaches one side of the N⁻ type source and drain regions 5b in the second active region II. A bit line 20 is formed in such a way as to bury the contact hole 19 with an interconnection material and is elongated behind the contact hole 19 parallel to the opposing direction of the source and drain regions 5b.

Figure 5D:
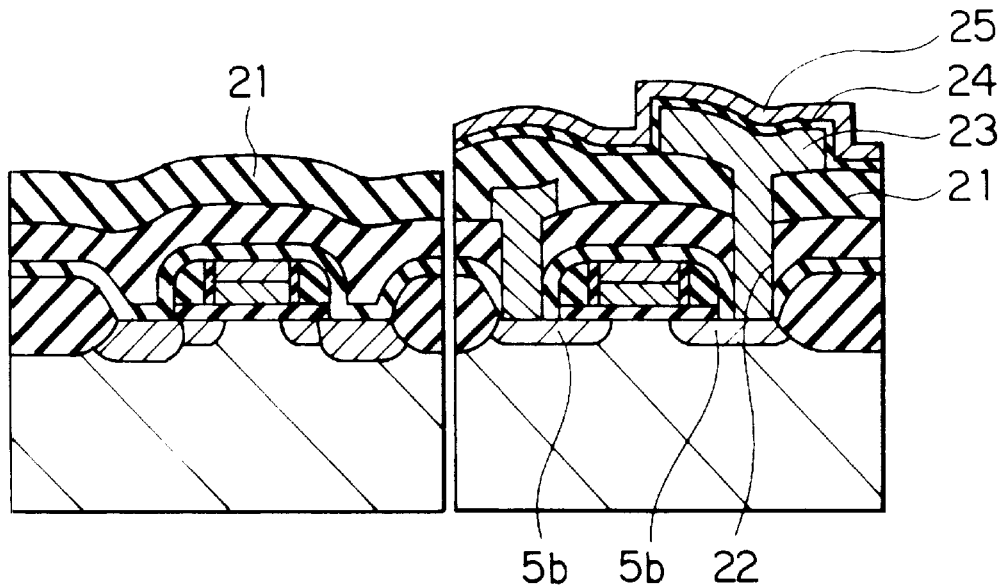

Then, an interlayer insulating film 21 is formed on the entire surface, and a contact hole 22 which reaches the other side of the N⁻ type source and drain region 5b in the second active region II is formed in this interlayer insulating film 21, as shown in FIG. 5D. A capacitor lower electrode 23 is formed on the interlayer insulating film 21 in the active region II in such a way as to bury the contact hole 22. A capacitor insulating film 24 is formed on the interlayer insulating film 21 and the capacitor lower electrode 23 in the second active region II, and a capacitor upper electrode 25 is formed on this capacitor insulating film 24.

Figure 5E:
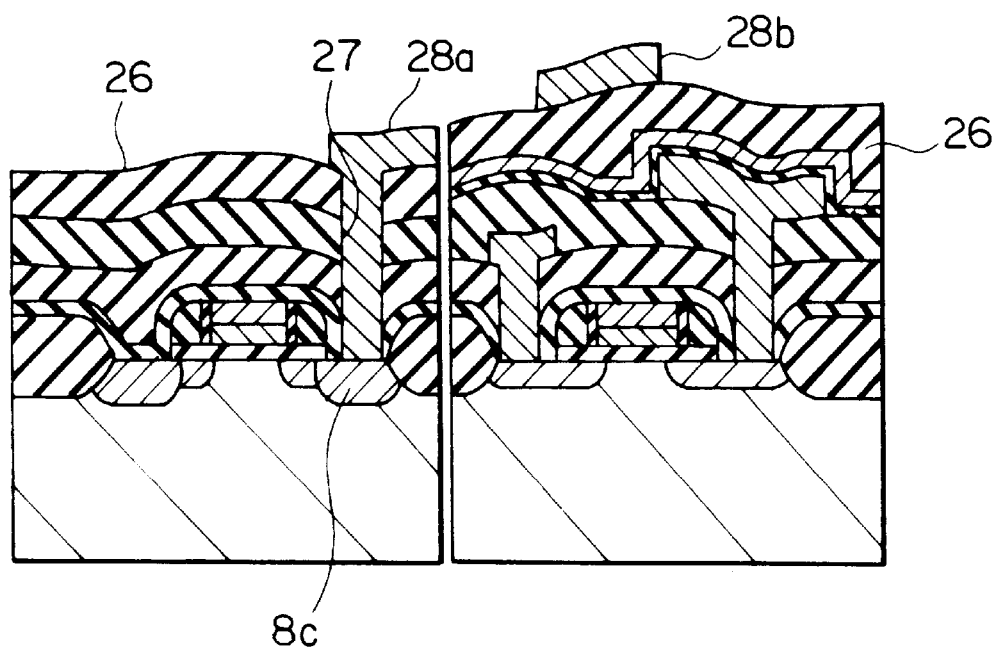

Next, as shown in FIG. 5E, an interlayer insulating film 26 is formed on the entire surfaces of the active regions I and II, a contact hole 27 which reaches one side of the N⁺ type source and drain region 8c in the first active region I is formed and interconnection layers 28a and 28b of aluminum are then formed.

In this manner, an LDD-IGFET for a peripheral circuit for a semiconductor memory can be formed in the first active region I, and a DRAM memory cell can be formed in the second active region. Because an IGFET constituting a DRAM memory cell does not have an N⁺ type source and drain region, the leak current at the PN junction formed between this source and drain region and the substrate is further reduced, thus ensuring a better retaining characteristic of the memory cell. At the time the N⁺ type source and drain region 8c needed for the LDD-IGFET is formed, the N⁻ type source and drain region 5b of the IGFET in the second active region II is covered with the silicon oxide film 13, so that the aforementioned contamination by metal oxide can be avoided.

Although the foregoing description has been given of the fabrication of an N channel MOS transistor, this invention may of course be adapted to the fabrication of a P channel MOS transistor and CMOS integrated circuit (IC).

Although the foregoing description of the individual embodiments has discussed a polycide gate electrode having tungsten silicide as one example of the gate electrode, this invention may of course be adapted to the fabrication of an IGFET which has another type of polycide gate electrode or a high melting-point metal (refractory metal) silicide gate electrode.

As described above, this invention has an advantage of recovering the breakdown voltage of the gate insulating film which has been damaged at the time of forming the gate electrode because, after the patterning of the gate electrode containing a refractory metal silicide film, the source-and-drain forming region is thermally oxidized, unexposed, while being covered with a gate insulating film in this invention, and another advantage of preventing the leak current at the PN junction from increasing because metal oxide contained in the oxide film which is formed on the source-and-drain region is made less than the one in the case where the source-and-drain region is exposed. Because the second insulating film is deposited by chemical vapor deposition on the substrate surface which is exposed at the time of forming the insulating spacer on the side surface of the gate electrode, metal oxide is not contained in this insulating film unlike in the case of performing thermal oxidation. Therefore, the contamination of the source and drain region by the metal oxide is avoided to prevent the leak current from increasing.

In short, this invention can fabricate an LDD-IGFET having a gate electrode containing a high melting-point metal silicide film, whose gate insulating film has an excellent breakdown voltage and which has a suppressed leak current.

What is claimed is:

1. A method of fabricating a field effect transistor with an LDD structure comprising the steps of:

forming a gate insulating film on an active region on a surface of a semiconductor substrate;

selectively covering said gate insulating film to form a gate electrode including a high melting-point metal silicide film;

forming a thermal oxide film on a top surface and a side surface of said gate electrode with said active region covered completely by said gate insulating film;

forming a low-concentration source and drain region in said active region by first ion injection;

depositing a first insulating film and performing anisotropic etching to form an insulating spacer on said side surface of said gate electrode and expose said top surface of said gate electrode and said low-concentration source and drain region; and depositing a second insulating film for covering said top surface of said gate electrode and said low-concentration source and drain region exposed by said anisotropic etching and then forming a high-concentration source and drain region in said active region by second ion injection.

2. A method of fabricating a field effect transistor with an LDD structure comprising the steps of:

forming a device-forming area in a surface portion of a semiconductor substrate to define a first active region and a second active region;

forming a first gate insulating film and a second gate insulating film respectively on surfaces of said first active region and said second active region;

selectively covering said first gate insulating film and said second gate insulating film to form a first gate electrode and a second gate electrode each including a high melting-point metal silicide film;

forming thermal oxide films on top and side surfaces of said first gate electrode and said second gate electrode, with said first active region and said second active region covered completely by said first gate insulating film and said second gate insulating film, respectively;

forming a low-concentration source and drain region in both said first and second active regions by first ion injection;

depositing a first insulating film and performing anisotropic etching to form an insulating spacer on said side surfaces of said first and second gate electrodes and expose said top surface of said gate electrodes and said low-concentration source and drain region;

depositing a second insulating film for covering said top surface of said gate electrodes and said low-concentration source and drain region exposed by said anisotropic etching; and covering said second active region with a mask and then performing second ion injection to form a high-concentration source and drain region in said first active region.

3. The method according to claim 1, further comprising the steps of:

coating an amorphous high-melting point silicide film containing stoichiometric silicon rich silicide; and patterning said amorphous high-melting point silicide film to form a gate electrode which is polycrystallized at a time of forming a thermal oxide film.

4. The method according to claim 2, further comprising the steps of:

coating an amorphous high-melting point silicide film containing stoichiometric silicon rich silicide; and patterning said amorphous high-melting point silicide film to form a gate electrode which is polycrystallized at a time of forming a thermal oxide film.

5. The method according to claim 1, wherein said gate electrode is a polycide gate electrode.

6. The method according to claim 2, wherein said gate electrodes are a polycide gate electrode.

7. The method according to claim 1, wherein said step of selectively covering said gate insulating film to form a gate electrode includes the steps of:

forming a polycrystalline silicon film doped with phosphorous by chemical vapor deposition;

forming an amorphous high-melting point silicide film containing stoichiometric silicon rich refractory metal silicide;

etching said amorphous high-melting point silicide film with a gas mixture of $SF_6$, HBr and He; and etching said polycrystalline silicon film with a gas mixture of $CI_2$ and HBr.

8. The method according to claim 2, wherein said step of selectively covering said first gate insulating film and said second gate insulating film includes the steps of:

forming a polycrystalline silicon film doped with phosphorous by chemical vapor deposition;

forming an amorphous high-melting point silicide film containing stoichiometric silicon rich refractory metal silicide;

etching said amorphous high-melting point silicide film with a gas mixture of $SF_6$, HBr and He; and etching said polycrystalline silicon film with a gas mixture of $CI_2$ and HBr.

9. A method of fabricating a field effect transistor with an LDD structure comprising the steps of:

forming a gate insulating film on an active region on a surface of a semiconductor substrate;

selectively covering said gate insulating film to form a gate electrode including a high melting-point metal silicide film;

forming a thermal oxide film on a top surface and a side surface of said gate electrode with said active region covered completely by said gate insulating film;

forming a low-concentration source and drain region in said active region by first ion injection;

depositing a first insulating film on said thermal oxide film and said low-concentration source and drain;

anisotropically etching said first insulator to form an insulating spacer on said side surface of said gate electrode and expose said top surface of said gate electrode and said low-concentration source and drain region;

depositing a second insulating film for covering said top surface of said gate electrode and said low-concentration source and drain region exposed by said anisotropic etching; and forming a high-concentration source and drain region in said active region by second ion injection.

10. The method according to claim 9, further comprising the steps of:

coating an amorphous high-melting point silicide film containing stoichiometric silicon rich refractory metal silicide; and patterning said amorphous high-melting point silicide film to form a gate electrode which is polycrystallized at a time of forming a thermal oxide film.

11. The method according to claim 10, wherein said step of selectively covering said gate insulating film to form a gate electrode includes the steps of:

forming a polycrystalline silicon film doped with phosphorous by chemical vapor deposition;

forming an amorphous high-melting point silicide film containing stoichiometric silicon rich refractory metal silicide;

etching said amorphous high-melting point silicide film with a gas mixture of $SF_6$, HBr and He; and etching said polycrystalline silicon film with a gas mixture of $Cl_2$ and HBr.

12. A method of fabricating a lightly doped diffusion (LDD) field effect transistor structure comprising the steps of:

depositing a first insulating film over an entire transistor active region having a gate insulating layer, a silicide gate electrode covered by an oxide film, and a low-concentration source and drain region;

anisotropically etching said first insulating film to form an insulating spacer on a side surface and a top surface of said silicide gate electrode, and expose said top surface of said silicide gate electrode and said low-concentration source and drain region;

depositing a second insulating film on said top surface of said silicide gate electrode and said low-concentration source and drain region exposed by said anisotropic etching; and forming a high-concentration source and drain region in said transistor active region by ion injection after said step of depositing a second insulating film.

13. The method according to claim 1, wherein said second insulating film is deposited by chemical vapor deposition (CVD).

14. The method according to claim 2, wherein said second insulating film is deposited by chemical vapor deposition (CVD).

15. The method according to claim 9, wherein said second insulating film is deposited by chemical vapor deposition (CVD).

16. The method according to claim 12, wherein said second insulating film is deposited by chemical vapor deposition (CVD).

* * * * *